United States Patent
Fukushima et al.

(10) Patent No.: US 10,032,952 B2
(45) Date of Patent: Jul. 24, 2018

(54) CONNECTING STRUCTURE AND SOLAR CELL MODULE

(75) Inventors: Naoki Fukushima, Chikusei (JP); Isao Tsukagoshi, Tokyo (JP); Takehiro Shimizu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 245 days.

(21) Appl. No.: 12/615,244

(22) Filed: Nov. 9, 2009

(65) Prior Publication Data

US 2010/0108141 A1 May 6, 2010

Related U.S. Application Data

(63) Continuation of application No. PCT/JP2008/058488, filed on May 7, 2008.

(30) Foreign Application Priority Data

May 9, 2007 (JP) ................ P2007-124438
Sep. 18, 2007 (JP) ................ P2007-241230

(51) Int. Cl.
*H01L 31/05* (2014.01)
*H01L 31/0236* (2006.01)
(Continued)

(52) U.S. Cl.
CPC ............ *H01L 31/186* (2013.01); *C09J 5/06* (2013.01); *C09J 7/22* (2018.01); *C09J 7/35* (2018.01);
(Continued)

(58) Field of Classification Search
CPC ... H01L 31/05; H01L 31/0512; H01L 31/186; H01L 31/0201; H01L 31/0224;
(Continued)

(56) References Cited

U.S. PATENT DOCUMENTS 5,296,043 A * 3/1994 Kawakami et al. .......... 136/244
5,391,235 A 2/1995 Inoue
(Continued)

FOREIGN PATENT DOCUMENTS

CN  1532253 A  9/2004
CN  1632033 A  6/2005
(Continued)

OTHER PUBLICATIONS

Chen, Ono, Teii and Yoshino, Improvement of the adhesion of the resin to the metal surface by using plasma jet, 1997, Surface and Coatings Technology, 97, 378-384.*
(Continued)

*Primary Examiner* — Magali P Slawski
*Assistant Examiner* — Kourtney R S Carlson
(74) *Attorney, Agent, or Firm* — Griffin and Szipl PC

(57) ABSTRACT

The electric conductor connection method of the invention is a method for electrical connection between a mutually separated first electric conductor and second electric conductor, comprising a step of hot pressing a metal foil, a first adhesive layer formed on one side of the metal foil and a first electric conductor, arranged in that order, to electrically connect and bond the metal foil and first electric conductor, and hot pressing the metal foil, the first adhesive layer or second adhesive layer formed on the other side of the metal foil, and the second electric conductor, arranged in that order, to electrically connect and bond the metal foil and the second electric conductor.

13 Claims, 6 Drawing Sheets

(51) Int. Cl.
  *H01L 31/18*    (2006.01)
  *C09J 5/06*     (2006.01)
  *C09J 9/02*     (2006.01)
  *C09J 7/35*     (2018.01)
  *C09J 7/22*     (2018.01)

(52) U.S. Cl.
  CPC ............ *C09J 9/02* (2013.01); *H01L 31/0512* (2013.01); *C09J 2201/128* (2013.01); *C09J 2201/602* (2013.01); *C09J 2203/322* (2013.01); *C09J 2400/163* (2013.01); *Y02E 10/50* (2013.01); *Y10T 29/49194* (2015.01)

(58) Field of Classification Search
  CPC ..... H01L 31/0236; H01L 33/38; H02S 40/36; C09J 7/35; C09J 7/22; C09J 5/06; C09J 9/02; C09J 2201/128; C09J 2201/602; C09J 2203/322; C09J 2400/163
  USPC .......................................................... 136/256
  See application file for complete search history.

(56) References Cited

U.S. PATENT DOCUMENTS

| | | | |
|---|---|---|---|
| 5,509,557 | A | 4/1996 | Jimarez et al. |
| 5,847,316 | A | 12/1998 | Takada |
| 5,951,786 | A * | 9/1999 | Gee et al. ...................... 136/256 |
| 6,121,542 | A * | 9/2000 | Shiotsuka et al. ............ 136/256 |
| 6,328,844 | B1 | 12/2001 | Watanabe et al. |
| 6,365,840 | B1 | 4/2002 | Honda et al. |
| 6,471,816 | B1 | 10/2002 | Shuto et al. |
| 6,593,522 | B2 | 7/2003 | Nakano et al. |
| 6,986,937 | B2 | 1/2006 | Yamazaki et al. |
| 2001/0005053 | A1 | 6/2001 | Kitae et al. |
| 2001/0037825 | A1 | 11/2001 | Nakano et al. |
| 2003/0178138 | A1* | 9/2003 | Tsukagoshi ............... B32B 7/12 156/326 |
| 2004/0151884 | A1 | 8/2004 | Higashitani |
| 2004/0161593 | A1 | 8/2004 | Yamazaki et al. |
| 2004/0200522 | A1* | 10/2004 | Fukawa et al. .............. 136/259 |
| 2004/0214979 | A1 | 10/2004 | Fujinawa et al. |
| 2005/0115602 | A1 | 6/2005 | Senta et al. |
| 2005/0202261 | A1 | 9/2005 | Takai et al. |
| 2006/0102228 | A1* | 5/2006 | Sridharan ................. C03C 3/07 136/256 |
| 2006/0272844 | A1* | 12/2006 | Berghofer ........... H01L 31/0508 174/94 R |
| 2007/0055039 | A1 | 3/2007 | Usui et al. |
| 2007/0175579 | A1 | 8/2007 | Otani et al. |
| 2007/0235077 | A1 | 10/2007 | Nagata et al. |
| 2008/0121266 | A1* | 5/2008 | Tsunomura et al. .......... 136/244 |
| 2009/0293934 | A1* | 12/2009 | Okada et al. ................. 136/246 |
| 2010/0051338 | A1 | 3/2010 | Takai et al. |
| 2010/0116314 | A1 | 5/2010 | Fukushima et al. |
| 2011/0114256 | A1 | 5/2011 | Otani et al. |

FOREIGN PATENT DOCUMENTS

| | | |
|---|---|---|
| CN | 1662120 A | 8/2005 |
| CN | 1867602 A | 11/2006 |
| CN | 1890339 A | 1/2007 |
| JP | 58-135445 | 9/1983 |
| JP | 63-50283 Y2 | 12/1988 |
| JP | 1309206 A | 12/1989 |
| JP | 6-265924 A | 9/1994 |
| JP | 8-3081 | 1/1996 |
| JP | 11-16502 A | 1/1999 |
| JP | 11-40225 | 2/1999 |
| JP | 11-080682 | 3/1999 |
| JP | 2000269637 A | 9/2000 |
| JP | 2000286436 A | 10/2000 |
| JP | 2000331537 A | 11/2000 |
| JP | 2001323249 A | 11/2001 |
| JP | 2001-343903 A | 12/2001 |
| JP | 2001-345132 A | 12/2001 |
| JP | 2001-345460 A | 12/2001 |
| JP | 2002094090 A | 3/2002 |
| JP | 2002-204052 A | 7/2002 |
| JP | 2002280688 A | 9/2002 |
| JP | 2004204256 A | 7/2004 |
| JP | 2004-247402 A | 9/2004 |
| JP | 2005-099693 A | 4/2005 |
| JP | 2005101519 A | 4/2005 |
| JP | 2005-243935 A | 9/2005 |
| JP | 2006-28521 A | 2/2006 |
| JP | 2006-059991 | 3/2006 |
| JP | 3123842 U | 7/2006 |
| JP | 2006-233203 A | 9/2006 |
| JP | 2007-56209 A | 3/2007 |
| JP | 2007-095941 A | 4/2007 |
| JP | 2007-158302 | 6/2007 |
| JP | 2007-214533 | 8/2007 |
| KR | 10-0563890 B1 | 3/2006 |
| KR | 10-2006-0116451 | 11/2006 |
| TW | 2005-05674 A | 2/2005 |
| TW | I253979 B | 5/2006 |
| TW | I602899 B | 10/2017 |
| WO | 2006/051864 A1 | 5/2006 |
| WO | WO 2007055253 A1 * | 5/2007 |

OTHER PUBLICATIONS

Machine English Translation of KANEKO JP 2001-343903.*
Office Action issued in counterpart Taiwanese application 097117347 dated Oct. 31, 2011 (no translation available; submitted for certification).
International Search Report, issued in corresponding application No. PCT/JP2008/058488, completed Aug. 4, 2008, dated Aug. 12, 2008.
Office Action issued in a related Taiwanese Patent Application No. 097117008, dated May 30, 2011.
Office Action issued in a related Japanese Patent Application No. P2009-514130, dated Jun. 21, 2011.
Office Action dated Aug. 19, 2011 in counterpart Korean application 10-2011-7012768 (no translation available, submitted for certification).
Office Action issued in co-pending related Korean application 10-2009-7014260, dated Mar. 2, 2011 (no translation available, submitted for certification purposes only).
Office Action issued in co-pending related Chiinese application 200880014826.6, dated Dec. 9, 2010 (no translation available).
"Surface Roughness—Definition and Designation," JIS B 0601-1994, JIS Rev Jan. 20, 2001, Revised Feb. 1, 1994, published by Japanese Standard Associations.
International Preliminary Report on Patentability issued in related application PCT/JP2008/058486, issued Nov. 24, 2009 dated Dec. 3, 2009.
Office Action issued in related Japanese application P2011-180849 dated Oct. 16, 2012 (no translation available; submitted for certification).
Notification of Information Provision issued in counterpart Japanese application 2009-514129 dated Apr. 24, 2012.
JP 2001-323249 A Online Machine Translation as provided by The Industrial Property Digital Library (IPDL) (http://www19.ipdl.inpit.go.jp/PA1/cgi-bin/PA1INIT?1349487715613), translated on Oct. 5, 2012.
Office Action issued in co-pending related U.S. Appl. No. 12/615,251 dated Oct. 19, 2012.
English abstract of JP 6-350283 A dated Dec. 22, 1994 for "Electromagnetic Shielding Room," downloaded Nov. 5, 2012.
Office Action dated Oct. 24, 2012 in related Chinese application 200880013878.1 (no translation available; submitted for certification).
Office Action issued in related Chinese application 20111011270.X dated Jun. 25, 2013 (no translation available; submitted for certification).
Office Action issued in related Japanese application 2012-102490 dated Jul. 2, 2013 (no translation available; submitted for certification).

(56) References Cited

OTHER PUBLICATIONS

Applicant-Initiated Interview Summary issued in co-pending related U.S. Appl. No. 13/835,018 dated Feb. 5, 2014.
Office action issued in a related Chinese patent application 200880013878.1 dated Nov. 18, 2013 (no translation available; submitted for certification.).
Office action issued in a related Chinese patent application 200880014826.6 dated Jan. 24, 2013 (no translation available; submitted for certification.).
Office Action issued in a related U.S. Appl. No. 13/835,018 dated Dec. 26, 2013.
Curing, McGraw-Hill Dictionary of Scientific and Technical Terms 526 (6th ed. 2003).
Tsunomura et al., JP 2007-095941 A Online Machine Translation as provided by The Industrial Property Digital Library (IPDL) (accessed from http://www19.ipdl.inpit.go.jp/PA1/cgi-bin/PA1INDEX), translated on Jul. 17, 2013.
Tsukakoshi et al. , JP 6-350283 translation, Dec. 23, 1988.
Non-Final Office Action issued in co-pending related U.S. Appl. No. 14/596,581 dated Aug. 28, 2015.
Office Action issued in co-pending related U.S. Appl. No. 13/835,018 dated Jun. 29, 2016.

\* cited by examiner

CONNECTING STRUCTURE AND SOLAR CELL MODULE

RELATED APPLICATIONS

This application is based upon and claims the benefit of priorities from International Application No. PCT/JP2008/058488 filed on May 7, 2008, Japanese Patent Application No. 2007-124438 filed on May 9, 2007, and Japanese Patent Application No. 2007-241230 filed on Sep. 18, 2007, the entire contents of which are incorporated herein by reference.

BACKGROUND OF THE INVENTION

Field of the Invention

The present invention relates to an electric conductor connection method, an electric conductor connecting member, a connection structure and a solar cell module.

Related Background Art

Solar cell modules have a construction wherein a plurality of solar cells are connected in series and/or in parallel via wiring members that are electrically connected to their surface electrodes. Solder has traditionally been used for connection between electrodes and wiring members (see Patent document 1, for example). Solder is widely used because of its excellent connection reliability, including conductivity and anchoring strength, low cost and general applicability.

Wiring connection methods that do not employ solder have been investigated, as well, from the viewpoint of environmental protection. For example, Patent documents 2 and 3 disclose connection methods employing paste-like or film-like conductive adhesives.

[Patent document 1] Japanese Unexamined Patent Publication No. 2004-204256
[Patent document 2] Japanese Unexamined Patent Publication No. 2000-286436
[Patent document 3] Japanese Unexamined Patent Publication No. 2005-101519

SUMMARY OF THE INVENTION

Problems to be Solved by the Invention

In the connection method employing solder described in Patent document 1, given a solder melting temperature of generally about 230-260° C., the high temperature of connection and the volume shrinkage of the solder adversely affect the solar cell semiconductor structure, tending to impair the characteristics of the fabricated solar cell module. In addition, the recent decreasing thicknesses of semiconductor boards have tended to result in even more cell cracking and warping. Moreover, because solder connection does not allow easy control of the distance between electrodes and wiring members, it has been difficult to obtain satisfactory dimensional precision for packaging. When sufficient dimensional precision cannot be achieved, product yield tends to be reduced during the packaging process.

On the other hand, methods of establishing connection between electrodes and wiring members using conductive adhesives, as described in Patent documents 2 and 3, allow bonding to be achieved at low temperature compared to using solder, thus potentially reducing the adverse effects on solar cells by heating at high temperature. In order to fabricate a solar cell module by this method, however, it is necessary to repeat a step of first applying or laminating a paste-like or film-like conductive adhesive on a solar cell electrode to form an adhesive layer and then positioning and subsequently bonding a wiring member on the formed adhesive layer, for each electrode. The connection step is therefore complex, resulting in reduced productivity for solar cell modules.

It is an object of the present invention, which has been accomplished in light of these circumstances, to provide an electric conductor connection method and electric conductor connecting member which can simplify the connection steps for electrical connection between mutually separate electric conductors, while also obtaining excellent connection reliability. It is a further object of the invention to provide a connection structure and solar cell module whereby excellent productivity and high connection reliability can both be achieved.

Means for Solving the Problems

In order to solve the problems mentioned above, the invention provides an electric conductor connection method which is a method for electrical connection between a mutually separated first electric conductor and second electric conductor, comprising a step of hot pressing a metal foil, a first adhesive layer formed on one side of the metal foil and a first electric conductor, arranged in that order, to electrically connect and bond the metal foil and first electric conductor, and hot pressing the metal foil, the first adhesive layer or a second adhesive layer formed on the other side of the metal foil, and the second electric conductor, arranged in that order, to electrically connect and bond the metal foil and the second electric conductor.

According to the electric conductor connection method of the invention, a metal foil having a preformed adhesive layer is used, making it possible to easily form an adhesive layer with controlled thickness between electric conductors and metal foils serving as a wiring members in electrical connection with each electric conductor, and to accomplish satisfactory bonding, as well as to connect electric conductors and metal foils at lower temperature than when using solder (particularly at 200° C. and below), and to sufficiently minimize cracking and warping of electric conductor-formed substrates. Thus, according to the electric conductor connection method of the invention, it is possible to simplify the connection steps for electrical connection between mutually separate electric conductors, while also obtaining excellent connection reliability.

The thickness of the first adhesive layer, or the thickness of the first adhesive layer and second adhesive layer for the electric conductor connection method of the invention preferably satisfies the condition specified by the following formula (1).

$$0.8 \leq t/Rz \leq 1.5 \tag{1}$$

In formula (1), t represents the thickness (μm) of the adhesive layer, and Rz represents the ten-point height of roughness profile (μm) on the surface of the electric conductor in contact with the adhesive layer.

Throughout the present specification, the ten-point height of roughness profile is the value calculated according to JIS-B0601-1994, and it is determined by observation with an ultradeep three-dimensional profile microscope (for example, a "VK-8510" ultradeep three-dimensional profile microscope by Keyences), and calculation by imaging and analysis software. The thickness of the adhesive layer is the value measured with a micrometer.

Setting the thickness of the adhesive layer so as to satisfy the aforementioned condition based on the surface roughness of the electric conductor to be connected can further improve the connection reliability, and particularly the connection reliability at high-temperature and high-humidity.

According to the electric conductor connection method of the invention, the ten-point height of roughness profile Rz1 (μm) on the surface of the first electric conductor in contact with the metal foil and the ten-point height of roughness profile Rz2 (μm) on the surface of the second electric conductor in contact with the metal foil are preferably between 2 μm and 30 μm.

An electric conductor surface having such roughness will facilitate filling of the adhesive into the surface roughness sections of the electric conductor while also facilitating contact of the protrusions at the surface roughness sections with the metal foil, thus helping to achieve a higher level of connection reliability.

According to the electric conductor connection method of the invention, the first adhesive layer or the first adhesive layer and second adhesive layer preferably contain a thermosetting resin and latent curing agent, from the viewpoint of high bond strength and heat resistance.

From the viewpoint of increasing the number of contact points during connection for a low resistance effect and further improving the connection reliability by preventing inclusion of voids at joints, it is preferred in the electric conductor connection method of the invention for the first adhesive layer or the first adhesive layer and second adhesive layer to contain conductive particles, and for the following condition (a) or (b) to be satisfied, where Ry1 (μm) is the maximum height on the surface of the first electric conductor in contact with the first adhesive layer and Ry2 (μm) is the maximum height on the surface of the second electric conductor in contact with the first adhesive layer or second adhesive layer.

(a) The maximum particle size $r1_{max}$ (μm) of the conductive particles in the first adhesive layer is no greater than the maximum height Ry1 and no greater than the maximum height Ry2.
(b) The maximum particle size $r1_{max}$ (μm) of the conductive particles in the first adhesive layer is no greater than the maximum height Ry1 and the maximum particle size $r2_{max}$ (μm) of the conductive particles in the second adhesive layer is no greater than the maximum height Ry2.

Throughout the present specification, the maximum height is the value calculated according to JIS-B0601-1994, and it is determined by observation with an ultradeep three-dimensional profile microscope (for example, a "W-8510" ultradeep three-dimensional profile microscope by Keyences), and calculation by imaging and analysis software.

From the viewpoint of conductivity, corrosion resistance and flexibility, the metal foil used in the electric conductor connection method of the invention is preferably one comprising at least one metal selected from among Cu, Ag, Au, Fe, Ni, Pb, Zn, Co, Ti, Mg, Sn and Al.

The invention further provides an electric conductor connecting member for electrical connection between mutually separate electric conductors, comprising a metal foil and an adhesive layer formed on at least one side of the metal foil.

According to the electric conductor connecting member of the invention having such a construction, it is possible to easily form an adhesive layer with controlled thickness between electric conductors and metal foils serving as wiring members in electrical connection with each electric conductor, and to accomplish satisfactory bonding, as well as to connect electric conductors and metal foils at lower temperature than when using solder (particularly at 200° C. and below), and to sufficiently minimize cracking and warping of electric conductor-formed substrates. Thus, according to the electric conductor connecting member of the invention, it is possible to simplify the connection steps for electrical connection between mutually separate electric conductors, while also obtaining excellent connection reliability.

An electric conductor connecting member according to the invention has an electric conductor with a rough surface, and the adhesive layer preferably has an adhesive volume sufficient to fill the surface roughness sections of the electric conductor, when the electric conductor connecting member is placed on the electric conductor so that the adhesive layer is between the metal foil and the electric conductor, and they are hot pressed until the metal foil and the electric conductor become electrically connected.

Ensuring such a volume of adhesive in the adhesive layer of the electric conductor connecting member can further improve the connection reliability.

The metal foil in the electric conductor connecting member of the invention is preferably band-shaped. This will provide an effect of simplifying the connection steps, ensuring a fixed width matching the joint while also facilitating automation during contiguous connection in the lengthwise direction.

The adhesive layer in the electric conductor connecting member of the invention preferably contains a thermosetting resin and latent curing agent from the viewpoint of high bond strength and heat resistance.

From the viewpoint of increasing the number of contact points to obtain an effect of low resistance during connection, and of further improving the connection reliability by preventing inclusion of voids at joints for the electric conductor connecting member of the invention, preferably the adhesive layer contains conductive particles and the maximum particle size $r_{max}$ (μm) of the conductive particles is no greater than Ry, where Ry (μm) is the maximum height on the surface of the electric conductor in contact with the adhesive layer.

From the viewpoint of conductivity, corrosion resistance and flexibility, the metal foil used in the electric conductor connecting member of the invention is preferably one comprising at least one metal selected from among Cu, Ag, Au, Fe, Ni, Pb, Zn, Co, Ti, Mg, Sn and Al.

The invention further provides a connection structure comprising a mutually separate first electrode and second electrode, a metal foil electrically connecting the first electrode and second electrode, a first bonding member which bonds the first electrode and metal foil, and a second bonding member which bonds the second electrode and metal foil.

The connection structure of the invention can be fabricated using the electric conductor connection method of the invention or using an electric conductor connecting member of the invention, so that both excellent productivity and high connection reliability can be achieved.

In the connection structure of the invention, the ten-point height of roughness profile Rz1 (μm) on the surface of the first electrode in contact with the metal foil and the ten-point height of roughness profile Rz2 (μm) on the surface of the second electrode in contact with the metal foil are preferably between 2 μm and 30 μm. This can further increase the connection reliability.

The first electrode and metal foil and the second electrode and metal foil in the connection structure of the invention are preferably electrically connected via conductive particles. The increased number of contact points between the electrodes and metal foil will make it possible to more effectively obtain low resistance and improved connection reliability.

From the viewpoint of conductivity, corrosion resistance and flexibility, the metal foil used in the connection structure of the invention is preferably one comprising at least one metal selected from among Cu, Ag, Au, Fe, Ni, Pb, Zn, Co, Ti, Mg, Sn and Al.

The invention still further provides a solar cell module having the connection structure of the invention, wherein the first electrode is a solar cell electrode and the second electrode is separate a solar cell electrode.

A solar cell module of the invention, having a connection structure according to the invention with the solar cells connected together, can be fabricated with the electric conductor connection method of the invention or with an electric conductor connecting member of the invention, so that both excellent productivity and high connection reliability can be achieved.

In a solar cell module of the invention, some or all of the sections of the metal foil other than the surface in contact with the first electrode and the surface in contact with the second electrode are preferably covered with a resin. This will help to effectively prevent electrical shorts due to contact between the metal foil and other conductive members, thus preventing corrosion of the metal foil and improving the durability of the metal foil.

When solar cells in the solar cell module of the invention are connected together in series by electric conductor connecting members comprising adhesive layers formed on both sides of metal foils, each of the adhesive layers can serve both for bonding between the metal foils and electrodes and as metal foil-covering resins, and such a solar cell module is highly reliable and convenient to produce.

DESCRIPTION OF THE PREFERRED EMBODIMENTS

Figure 1:
FIG. 1 is a schematic cross-sectional view showing an embodiment of an electric conductor connecting member according to the invention.

Preferred embodiments of the invention will now be explained in detail, with reference to the accompanying drawings as necessary. Through the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative.

Figure 2:
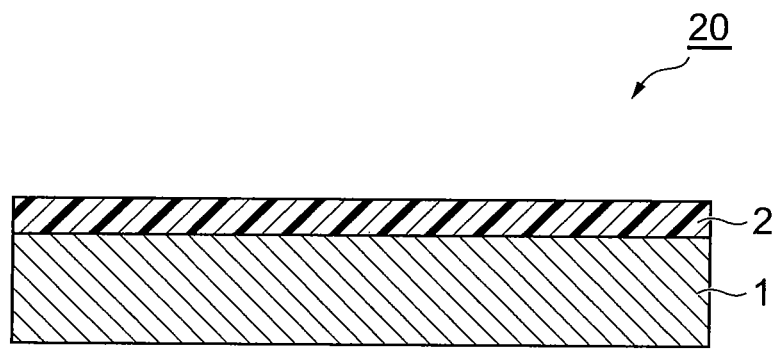
FIG. 2 is a schematic cross-sectional view showing another embodiment of an electric conductor connecting member according to the invention.

FIG. 1 is a schematic cross-sectional view showing an embodiment of an electric conductor connecting member according to the invention. The electric conductor connecting member 10 in FIG. 1 comprises a band-shaped metal foil 1, and a first adhesive layer 2 and second adhesive layer 3 formed on both main sides of the metal foil, and it has the form of an adhesive-attached metal foil tape. FIG. 2 is a schematic cross-sectional view showing another embodiment of an electric conductor connecting member according to the invention. The electric conductor connecting member 20 in FIG. 2 comprises a band-shaped metal foil 1 and a first adhesive layer 2 formed on one main side of the metal foil.

When the electric conductor connecting member 10 having the adhesive layers formed on both sides of the metal foil is used to fabricate a solar cell module as described hereunder, it is easy to carry out the connecting step for connection between the solar cell surface electrode and adjacent solar cell rear electrode. That is, since adhesive layers are provided on both sides, connection can be established between the surface electrode and rear electrode without reversing the electric conductor connecting member. Also, because the adhesive layer that does not contribute to connection with the electrodes functions as a covering material for the metal foil, this helps to effectively prevent electrical shorts due to contact between the metal foil and other conductive members, thus preventing corrosion of the metal foil and improving the durability of the metal foil. This effect can be obtained even when the electric conductor connecting member 10 is used for connection between electric conductors formed on the same surface.

On the other hand, the electric conductor connecting member 20 having an adhesive layer formed on one side of a metal foil facilitates fabrication of members and is superior in terms of cost, and consequently it is also suitable for connection between electric conductors formed on the same surface.

The electric conductor connecting members 10, 20 are in the form of adhesive-attached metal foil tapes, and for winding up into a tape, it is preferred either to provide a separator such as a release sheet on the adhesive layer side or, in the case of the electric conductor connecting member 20, to provide a back side treatment layer of silicon or the like on the back side of the metal foil 1.

As examples for the metal foil 1 there may be mentioned those containing one or more metals selected from among Cu, Ag, Au, Fe, Ni, Pb, Zn, Co, Ti, Mg, Sn and Al, as well as laminates thereof. Copper and aluminum foils which have excellent conductivity are preferred for this embodiment.

The thickness of the metal foil 1 may be about 5-150 μm. When the electric conductor connecting member of this embodiment is wound up as a tape, the thickness of the metal foil is preferably about 20-100 μm from the viewpoint of deformability and manageability. When the metal foil has a small thickness and lacks strength, it may be reinforced with a plastic film or the like.

From the standpoint of obtaining superior adhesiveness with the adhesive, the metal foil used for this embodiment is preferably a "electrolytic foil" having surface-smoothness or heterogeneous microirregularities electrochemically. Electrolytic copper foils used for copper-clad laminates as printed circuit board materials are particularly preferred because they are readily available as general purpose materials, and economical.

The adhesive layers 2, 3 may be widely used materials formed using thermoplastic materials or curable materials exhibiting curable properties under heat or light. The adhesive layer for this embodiment preferably contains a curable material from the viewpoint of excellent heat resistance and humidity resistance after connection.

Thermosetting resins may be mentioned as curable materials, and any publicly known ones may be used. As examples of thermosetting resins there may be mentioned epoxy resins, phenoxy resins, acrylic resins, phenol resins, melamine resins, polyurethane resins, polyester resins, polyimide resins and polyamide resins. From the standpoint of connection reliability, the adhesive layer preferably contains at least one from among epoxy resins, phenoxy resins and acrylic resins.

The adhesive layers 2, 3 preferably comprise a thermosetting resin and a latent curing agent for the thermosetting resin. A latent curing agent has relatively distinct active sites for reaction initiation by heat and/or pressure, and is suitable for connection methods that involve heating/pressing steps. The adhesive layers 2, 3 more preferably contain an epoxy resin and a latent curing agent for the epoxy resin. An adhesive layer formed from an epoxy-based adhesive containing a latent curing agent can be cured in a short period of time, has good workability for connection and exhibits excellent adhesion by its molecular structure.

As epoxy resins there may be mentioned bisphenol A-type epoxy resin, bisphenol F-type epoxy resin, bisphenol S-type epoxy resin, phenol-novolac-type epoxy resin, cresol-novolac-type epoxy resin, bisphenol A/novolac-type epoxy resin, bisphenol F/novolac-type epoxy resin, alicyclic epoxy resin, glycidyl ester-type epoxy resin, glycidyl amine-type epoxy resin, hydantoin-type epoxy resin, isocyanurate-type epoxy resin, aliphatic straight-chain epoxy resins and the like. These epoxy resins may be halogenated or hydrogenated. These epoxy resins may also be used in combinations of two or more.

As latent curing agents there may be mentioned anionic polymerizable catalyst-type curing agents, cationic polymerizable catalyst-type curing agents and polyaddition-type curing agents. Any of these may be used alone or in mixtures of two or more. Preferred among these are anionic and cationic polymerizable catalyst-type curing agents since they have excellent fast-curing properties and do not require special consideration in regard to chemical equivalents.

As examples of anionic or cationic polymerizable catalyst-type curing agents there may be mentioned tertiary amines, imidazoles, hydrazide-based compounds, boron trifluoride-amine complexes, onium salts (sulfonium salts, ammonium salts and the like), amineimides, diaminomaleonitrile, melamine and its derivatives, polyamine salts and dicyandiamides, as well as reformed compounds of the same. As polyaddition-type curing agents there may be mentioned polyamines, polymercaptanes, polyphenols, acid anhydrides and the like.

When a tertiary amine or imidazole is used as an anionic polymerizable catalyst-type curing agent, the epoxy resin is cured by heating at a moderate temperature of about 160° C.-200° C. for between several tens of seconds and several hours. This is preferred because it lengthens the pot life.

As cationic polymerizable catalyst-type curing agents there are preferred photosensitive onium salts that cure epoxy resins under energy ray exposure (mainly aromatic diazonium salts, aromatic sulfonium salts and the like). Aliphatic sulfonium salts are among those that are activated and cure epoxy resins by heat instead of energy ray exposure. Such curing agents are preferred because of their fast-curing properties.

Microcapsulated forms obtained by covering these curing agents with polyurethane-based or polyester-based polymer substances or inorganic materials such as metal thin-films of nickel or copper, or calcium silicate, are preferred as they can extend the pot life.

The active temperature of the adhesive layer is preferably 40-200° C. and more preferably 50-150° C. If the active temperature is below 40° C., the temperature difference against room temperature (25° C.) will be smaller and a low temperature will be required for storage of the connecting member, while if it is above 200° C. there will tend to be thermal effects on members other than those in the joints. The active temperature of the adhesive layer is the exothermic peak temperature upon temperature increase of the adhesive layer as the sample from room temperature at 10° C./min using a DSC (differential scanning calorimeter).

Setting a lower active temperature for the adhesive layer will tend to improve the reactivity but lower the storage life, and therefore it is preferably selected from both these considerations. That is, the electric conductor connecting member of this embodiment allows temporary connections to be made on electric conductors formed on boards, and allows metal foils and adhesive-attached boards to be obtained, by heat treatment at below the active temperature of the adhesive layer. Furthermore, setting the active temperature of the adhesive layer within the range specified above can ensure an adequate storage life of the adhesive layer while facilitating highly reliable connection upon heating at above the active temperature. This allows more effective two-stage curing wherein temporarily connected articles are collectively cured together afterwards. When such temporarily connected articles are produced, there is virtually no viscosity increase in the adhesive layer as curing reaction proceeds at below the active temperature, and therefore the microirregularities in the electrodes are filled well and production can be more easily managed.

The electric conductor connecting member of this embodiment can exhibit conductivity in the thickness direction utilizing the electrode surface roughness, but the adhesive layer preferably contains conductive particles from the viewpoint of increasing the number of indentation surfaces during connection to increase the number of contact points.

There are no particular restrictions on the conductive particles, and for example, gold particles, silver particles, copper particles, nickel particles, gold-plated nickel particles, gold/nickel plated plastic particles, copper-plated particles and nickel-plated particles may be mentioned. The conductive particles preferably have burr-shaped or spherical particle shapes from the viewpoint of the filling properties of the conductive particles into the adherend surface irregularities during connection. Specifically, conductive particles in such a form have higher filling properties for complex irregular shapes on metal foil and adherend surfaces, as well as high shape-following properties for variation caused by vibration or expansion after connection, and can therefore improve the connection reliability.

The conductive particles used for this embodiment have a particle size distribution in the range of about 1-50 μm, and preferably 1-30 μm.

From the viewpoint of further improving the connection reliability when the adhesive layer contains conductive particles, preferably the maximum particle size $r_{max}$ (μm) of the conductive particles is no greater than Ry, where Ry (μm)

is the maximum height on the surface of the electric conductor in contact with the adhesive layer.

Also, when the adhesive layer contains conductive particles and the surface of the metal foil on which the adhesive layer is formed is smooth, preferably the maximum particle size $r_{max}$ (μm) of the conductive particles is no greater than Rz, where Rz (μm) is the ten-point height of roughness profile on the surface of the electric conductor in contact with the adhesive layer. This will help to prevent inclusion of voids at the joints due to sections unfilled with the adhesive, and can provide an effect of improved connection reliability. Surface smoothness is defined as an Rz of less than 1 μm.

Also, when the adhesive layer contains conductive particles, preferably the maximum particle size $r_{max}$ (μm) of the conductive particles is no greater than the total of Rz and RzM, where Rz (μm) is the ten-point height of roughness profile on the surface of the electric conductor in contact with the adhesive layer and RzM (μm) is the ten-point height of roughness profile on the surface of the metal foil on which the adhesive layer has been formed. This will help to prevent inclusion of voids at the joints due to sections unfilled with the adhesive, and can provide an effect of improved connection reliability.

According to this embodiment, the maximum particle size of the conductive particles can be set depending on the surface roughness of the electric conductor to be connected (electrode, for example) or the surface roughnesses of the electric conductor and metal foil, to improve the connection reliability as mentioned above, and therefore conductive particles having a wide particle size distribution can be used. This will allow cost reduction compared to using conductive particles of uniform particle size that are employed for such purposes.

The content of conductive particles in the adhesive layer may be within a range that does not notably lower the adhesion of the adhesive layer, and for example, it may be up to 10 vol % and preferably 0.1-7 vol % based on the total volume of the adhesive layer.

When the adhesive layer contains a latent curing agent and conductive particles, the latent curing agent is preferably smaller than the mean particle size of the conductive particles from the standpoint of extending the storage life and obtaining both adhesion and conductivity with a smoother adhesive layer surface. The mean particle size D of the conductive particles can be determined by the following formula.

$$D = \Sigma nd/\Sigma n \quad \text{[Formula 1]}$$

Here, n represents the number of particles with maximum diameter d. The method of measuring the particle size may be an electron microscope, optical microscope, Coulter counter or light scattering method, all of which are commonly employed. When the particles have an aspect ratio, d is the center diameter. According to the invention, measurement is preferably conducted on at least 10 particles using an electron microscope.

When the electric conductor connecting member of this embodiment has an electric conductor with a rough surface, the adhesive layer preferably has an adhesive volume sufficient to fill the surface roughness sections of the electric conductor, when the electric conductor connecting member is placed on the electric conductor so that the adhesive layer is between the metal foil and the electric conductor, and they are hot pressed until the metal foil and the electric conductor become electrically connected, from the standpoint of further improving the connection reliability.

According to this embodiment, the thickness of the adhesive layer preferably satisfies the condition of the following formula (1), from the standpoint of ensuring the aforementioned adhesive volume while providing sufficient conductivity between the metal foil and electric conductor.

$$0.8 \leq t/Rz \leq 1.5 \quad (1)$$

In formula (1), t represents the thickness (μm) of the adhesive layer, and Rz represents the ten-point height of roughness profile (μm) on the surface of the electric conductor in contact with the adhesive layer.

The thickness of the adhesive layer is the value measured with a micrometer. When the metal foil surface on which the adhesive layer is formed is rough, the thickness of the adhesive layer is the distance between the surface of the metal foil with the ten-point height of roughness profile RzM (μm), and the adhesive surface.

From the viewpoint of further improving the connection reliability, the thickness of the adhesive layer is more preferably set so that t/Rz is 0.7-1.2, and even more preferably 0.8-1.1.

Also according to this embodiment, the thickness of the adhesive layer preferably satisfies the condition of the following formula (2), from the standpoint of more reliably filling the surface roughness sections of the electric conductor while providing sufficient conductivity between the metal foil and electric conductor.

$$0.6 \leq t/Ry \leq 1.3 \quad (2)$$

In formula (2), t represents the thickness (μm) of the adhesive layer, and Ry represents the maximum height (μm) on the surface of the electric conductor in contact with the adhesive layer.

From the viewpoint of further improving the connection reliability, the thickness t of the adhesive layer is preferably set with a safety margin around approximately the same value as the maximum height (μm) on the surface of the electric conductor in contact with the adhesive layer (a value such that t/Ry=approximately 1.0), as the center value. The present inventors believe that the reason for improved connection reliability under such conditions is that the spacing between the metal foil film and electric conductor is largely dependent on the largest section among the difference of elevation in the roughness consisting of irregularities on the surface of the electric conductor, i.e. Ry, and therefore setting the thickness of the adhesive layer based on Ry can reliably and easily achieve both filling properties and conductivity. The safety margin may be set in consideration of factors such as the shape and roughness of the electrode surface as the electric conductor to be connected, the roughness and shape of the metal foil, the flow properties of the adhesive layer and the amount of seepage of the adhesive during connection. According to this embodiment, the range for the safety margin is preferably set so that t/Ry is in the range of about 0.6-1.3, it is more preferably set so that t/Ry is in the range of 0.7-1.2, and it is most preferably set so that t/Ry is in the range of 0.8-1.1.

The adhesive layers 2, 3 may also contain, in addition to the components mentioned above, modifying materials such as silane-based coupling agents, titanate-based coupling agents or aluminate-based coupling agents in order to improve the adhesion or wettability between the curing agent, curing accelerator and substrate on which the electric conductor is formed, dispersing agents such as calcium phosphate or calcium carbonate in order to improve the dispersibility of the conductive particles, and chelate materials to prevent silver or copper migration.

The electric conductor connecting member of the embodiment described above may be placed on the electric conductor and hot pressed to bond the metal foil and electric conductor while achieving conduction with low resistance of no greater than about $10^{-1}$ Ω/cm² between the metal foil and electric conductor during electrification.

The electric conductor connecting member of this embodiment is suitable as a connecting member for connection between multiple solar cells in series and/or parallel.

The electric conductor connection method of the invention will now be explained.

The electric conductor connection method of this embodiment is a method for electrical connection between a mutually separated first electric conductor and second electric conductor, comprising a step of hot pressing a metal foil, a first adhesive layer formed on one side of the metal foil and a first electric conductor, arranged in that order, to electrically connect and bond the metal foil and first electric conductor, and hot pressing the metal foil, the first adhesive layer or a second adhesive layer formed on the other side of the metal foil, and the second electric conductor, arranged in that order, to electrically connect and bond the metal foil and the second electric conductor.

The electric conductor connecting member 10 or 20 of the embodiment described above may be used in the electric conductor connection method of this embodiment. When the electric conductor connecting member 10 is used, a first step in which one end of the electric conductor connecting member 10 is placed on the first electric conductor in the order: metal foil 1, first adhesive layer 2, first electric conductor, and these are hot pressed to electrically connect and bond the metal foil 1 and first electric conductor, and a second step in which the other end of the electric conductor connecting member 10 is placed on the second electric conductor in the order: metal foil 1, second adhesive layer 3, second electric conductor and these are hot pressed to electrically connect and bond the metal foil 1 and second electric conductor, may be carried out for electrical connection between the mutually separate first electric conductor and second electric conductor. The first step and second step may be carried out simultaneously or in the order of first step and second step, or in the reverse order. The second step may alternatively be a step in which the other end of the electric conductor connecting member 10 is placed on the second electric conductor in the order: metal foil 1, first adhesive layer 2, second electric conductor and these are hot pressed to electrically connect and bond the metal foil 1 and second electric conductor.

When the electric conductor connecting member 20 is used, a first step in which one end of the electric conductor connecting member 20 is placed on the first electric conductor in the order: metal foil 1, first adhesive layer 2, first electric conductor, and these are hot pressed to electrically connect and bond the metal foil 1 and first electric conductor, and a second step in which the other end of the electric conductor connecting member 20 is placed on the second electric conductor in the order: metal foil 1, first adhesive layer 2, second electric conductor and these are hot pressed to electrically connect and bond the metal foil 1 and second electric conductor, may be carried out for electrical connection between the mutually separate first electric conductor and second electric conductor. In this case as well, the first step and second step may be carried out simultaneously or in the order of first step and second step, or in the reverse order.

As examples of electric conductors to be connected by the electric conductor connection method of this embodiment, there may be mentioned solar cell bus electrodes, electromagnetic wave shield wiring or ground electrodes, semiconductor electrodes for short modes, and display electrodes.

As known materials that can be used to obtain electrical conduction for solar cell bus electrodes, there may be mentioned ordinary silver-containing glass paste, or silver paste, gold paste, carbon paste, nickel paste or aluminum paste obtained by dispersing conductive particles in adhesive resins, and ITO formed by firing or vapor deposition, but silver-containing glass paste electrodes are preferred from the viewpoint of heat resistance, conductivity, stability and cost. Solar cells generally have an Ag electrode and an Al electrode formed by screen printing or the like, on a semiconductor board composed of one or more Si single-crystal, polycrystal or amorphous materials. The electrode surfaces generally have irregularities of 3-30 μm. In particular, the electrodes formed on solar cells have a maximum height Ry of about 30 μm and are often rough with a ten-point height of roughness profile Rz of about 2-30 μm, and usually 2-18 μm.

The thickness of the first adhesive layer, or the thickness of the first adhesive layer and second adhesive layer for the electric conductor connection method of this embodiment preferably satisfies the condition specified by the following formula (1).

$$0.8 \leq t/Rz \leq 1.5 \tag{1}$$

In formula (1), t represents the thickness (μm) of the adhesive layer, and Rz represents the ten-point height of roughness profile (μm) on the surface of the electric conductor in contact with the adhesive layer.

Setting the thickness of the adhesive layer so as to satisfy the aforementioned condition based on the surface roughness of the electric conductor to be connected can further improve the connection reliability, and particularly the connection reliability at high-temperature and high-humidity.

From the viewpoint of further improving the connection reliability, the thickness of the adhesive layer is more preferably set so that t/Rz is 0.7-1.2, and even more preferably 0.8-1.1.

Also according to this embodiment, the thickness of the first adhesive layer, or the thickness of the first adhesive layer and second adhesive layer, preferably satisfies the condition of the following formula (2), from the standpoint of more reliably filling the surface roughness sections of the electric conductor while providing sufficient conductivity between the metal foil and electric conductor.

$$0.6 \leq t/Ry \leq 1.3 \tag{2}$$

In formula (2), t represents the thickness (μm) of the adhesive layer, and Ry represents the maximum height (μm) on the surface of the electric conductor in contact with the adhesive layer.

From the viewpoint of further improving the connection reliability, the thickness t of the adhesive layer is preferably set with a safety margin around approximately the same value as the maximum height (μm) on the surface of the electric conductor in contact with the adhesive layer (a value such that t/Ry=approximately 1.0), as the center value. The safety margin may be set in consideration of factors such as the shape and roughness of the electrode surface as the electric conductor to be connected, the roughness and shape of the metal foil, the flow properties of the adhesive layer and the amount of seepage of the adhesive during connection. According to this embodiment, the range for the safety margin is preferably set so that t/Ry is in the range of about 0.6-1.3, it is more preferably set so that t/Ry is in the range of 0.7-1.2, and it is most preferably set so that t/Ry is in the range of 0.8-1.1.

According to the electric conductor connection method of this embodiment, the ten-point height of roughness profile Rz1 (μm) on the surface of the first electric conductor in contact with the metal foil and the ten-point height of roughness profile Rz2 (μm) on the surface of the second electric conductor in contact with the metal foil are preferably between 2 μm and 30 μm.

An electric conductor surface having such roughness will facilitate filling of the adhesive into the surface roughness sections of the electric conductor while also facilitating contact of the protrusions at the surface roughness sections with the metal foil, thus helping to achieve a higher level of connection reliability.

In the electric conductor connection method of this embodiment, the thickness of the adhesive layer is preferably determined as appropriate based on the ten-point height of roughness profile or maximum height on the electric conductor surface as mentioned above, but it is preferably about 3-30 μm from the viewpoint of both adhesion and conductivity, and more preferably 5-30 μm from the viewpoint of high reliability.

According to the electric conductor connection method of this embodiment, the first adhesive layer or the first adhesive layer and second adhesive layer preferably contain a thermosetting resin and latent curing agent from the viewpoint of high bond strength and heat resistance. The thermosetting resin and latent curing agent may be the same as explained for the electric conductor connecting member of this embodiment.

From the viewpoint of increasing the number of contact points during connection for a low resistance effect and further improving the connection reliability by preventing inclusion of voids at joints, it is preferred in the electric conductor connection method of this embodiment for the first adhesive layer or the first adhesive layer and second adhesive layer to contain conductive particles, and for the following condition (a) or (b) to be satisfied, where Ry1 (μm) is the maximum height on the surface of the first electric conductor in contact with the first adhesive layer and Ry2 (μm) is the maximum height on the surface of the second electric conductor in contact with the first adhesive layer or second adhesive layer.

(a) The maximum particle size $r1_{max}$ (μm) of the conductive particles in the first adhesive layer is no greater than the maximum height Ry1 and no greater than the maximum height Ry2.

(b) The maximum particle size $r1_{max}$ (μm) of the conductive particles in the first adhesive layer is no greater than the maximum height Ry1 and the maximum particle size $r2_{max}$ (μm) of the conductive particles in the second adhesive layer is no greater than the maximum height Ry2.

From the viewpoint of conductivity, corrosion resistance and flexibility, the metal foil used in the electric conductor connection method of this embodiment is preferably one comprising at least one metal selected from among Cu, Ag, Au, Fe, Ni, Pb, Zn, Co, Ti, Mg, Sn and Al.

The conditions for the heating temperature and pressing pressure are not particularly restricted so long as they are within a range that can ensure electrical connection between the metal foil and electric conductor and that allows bonding of the electric conductor and metal foil by the adhesive layer. The pressing and heating conditions are appropriately selected according to the purpose of use, the components in the adhesive layer and the material of the substrate on which the electric conductor is to be formed. For example, when the adhesive layer contains a thermosetting resin, the heating temperature may be a temperature at which the thermosetting resin cures. The pressing pressure may be in a range that sufficiently bonds the electric conductor and metal foil and does not damage the electric conductor or metal foil. Also, the heating and pressing time may be a time that does not cause excessive heat transfer to the substrate on which the electric conductor is formed, to avoid damage to or deterioration of the material. Specifically, the pressing pressure is preferably 0.1 MPa-10 MPa, the heating temperature is preferably 100° C.-220° C. and the heating/pressing time is preferably no longer than 60 seconds. These conditions are more preferably toward lower pressure, lower temperature and a shorter time.

Figure 3:
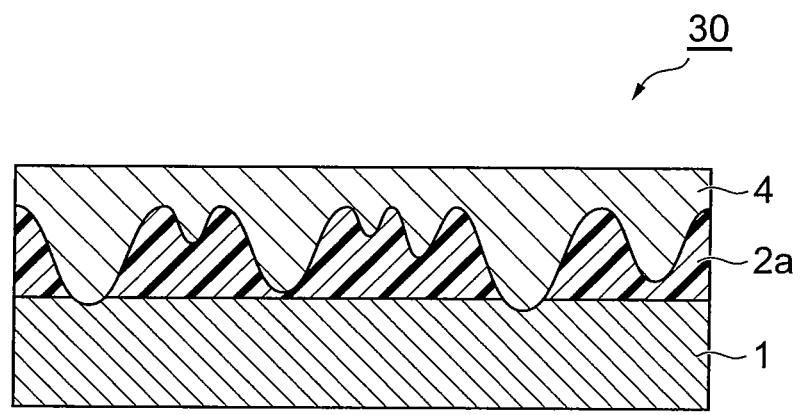
FIG. 3 is a schematic cross-sectional view showing part of a connection structure according to this embodiment.

FIG. 3 is a schematic cross-sectional view showing a portion of a connection structure connected by the electric conductor connection method of this embodiment. The connection structure 30 shown in FIG. 3 is obtained by placing a portion of the conductive connecting member 20 (adhesive-attached metal foil tape) of this embodiment on an electrode 4 as the electric conductor and hot pressing them, and it has a structure wherein part of the smooth surface or microprotrusion sections of the metal foil 1 of the conductive connecting member 20 directly contacts the protrusions of the electrode 4 while the metal foil 1 and electrode 4 are bonded by the cured product 2a of the adhesive layer 2 filling the surface roughness sections of the electrode 4. A connection structure 30 is also constructed by connecting the other portions of the conductive connecting member 20 on another electric conductor, by the same structure. According to this connection structure, the metal foil 1 and electrode 4 are kept anchored by the adhesive force or cure shrinkage force of the adhesive, thus stably maintaining the conductivity obtained between the metal foil 1 and electrode 4 and allowing sufficient connection reliability to be achieved between electric conductors.

Figure 4:
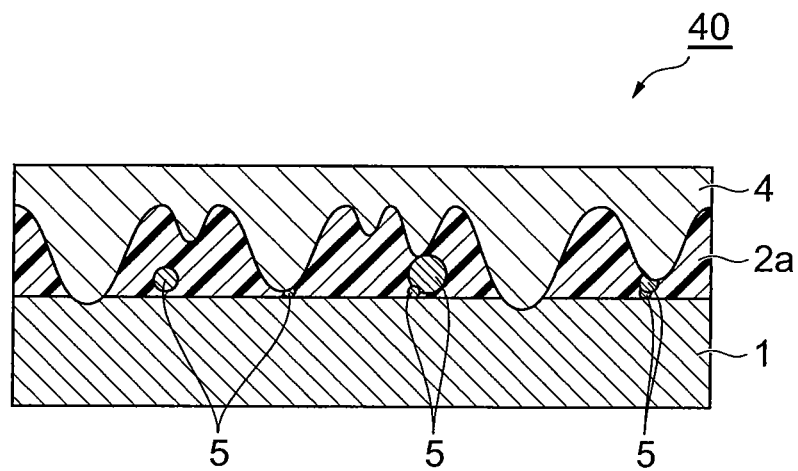
FIG. 4 is a schematic cross-sectional view showing part of a connection structure according to this embodiment.

FIG. 4 is a schematic cross-sectional view showing part of a connection structure with an adhesive layer 2 containing conductive particles. In the connection structure 40 shown in FIG. 4, contact points with the conductive particles 5 are increased, in addition to the contacts between the portions of the smooth surface or microprotrusion sections of the metal foil 1 and the protrusions of the electrode 4.

According to the electric conductor connection method according to the embodiment described above, the metal foil and electric conductor are satisfactorily bonded while low resistance conduction of no greater than about $10^{-1}$ Ω/cm² is also achieved between the metal foil and electric conductor during electrification.

The electric conductor connection method of this embodiment is suitable as a method for connecting multiple solar cells in series and/or parallel. The solar battery may have a construction that includes a solar cell module comprising a plurality of solar cells connected in series and/or in parallel and sandwiched between tempered glass or the like for environmental resistance, and provided with external terminals wherein the gaps are filled with a transparent resin.

Figure 5:
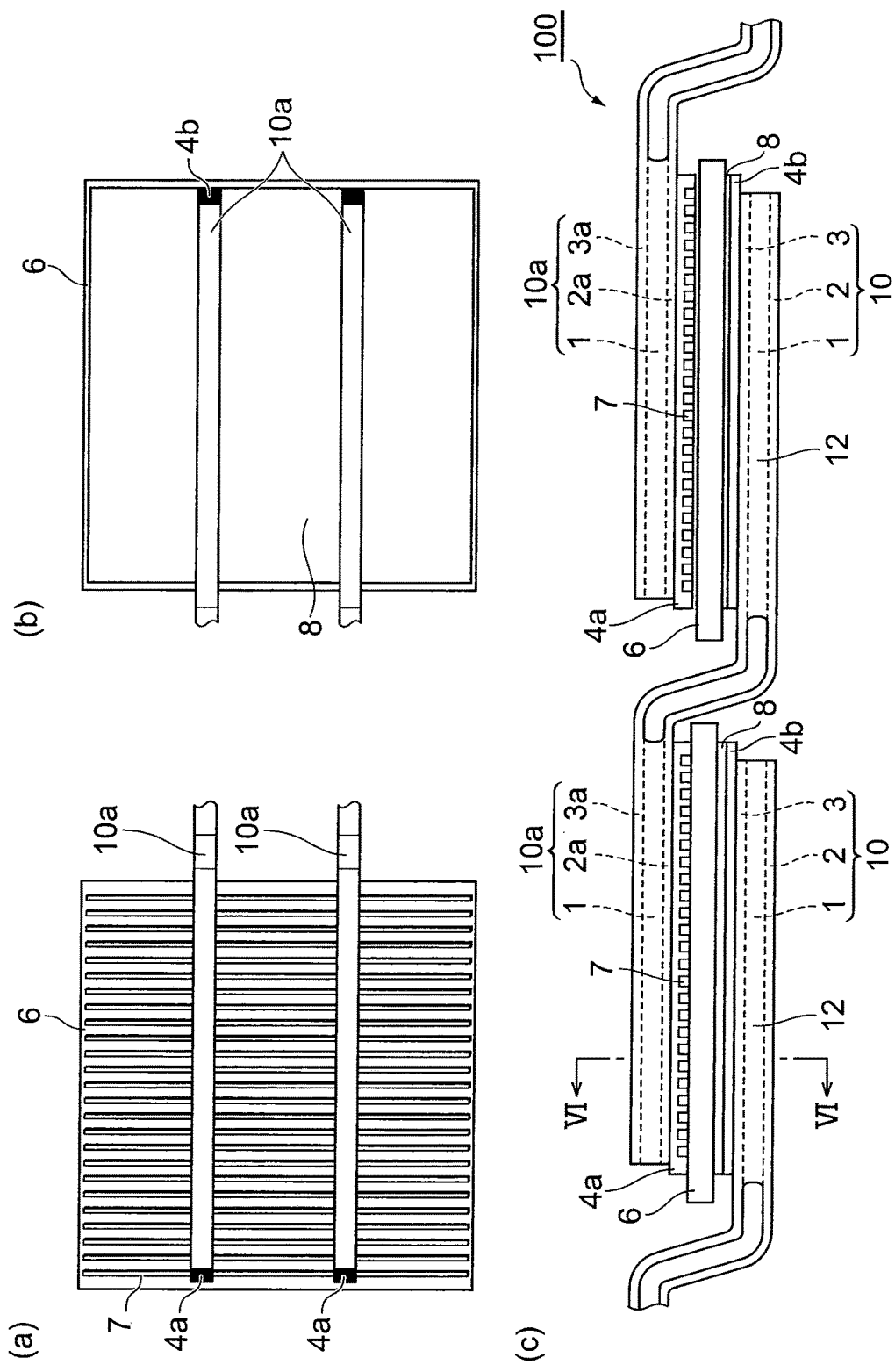
FIG. 5 is a schematic view of the essential part of a solar cell module according to this embodiment.

FIG. 5 is a schematic drawing showing the essential parts of a solar cell module according to this embodiment, as an overview of a structure with reciprocally wire-connected solar cells. FIG. 5(a) shows the front side of the solar cell module, FIG. 5(b) shows the rear side, and FIG. 5(c) shows an edge view.

As shown in FIGS. 5(a)-(c), the solar cell module 100 has solar cells, with grid electrodes 7 and bus electrodes (surface electrodes) 4a formed on the front side of a semiconductor wafer 6 and rear electrodes 8 and bus electrodes (surface electrodes) 4b formed on the rear side, the solar cells being reciprocally connected by wiring members 10a. The wiring members 10a each have one end connected to a bus electrode 4a as a surface electrode and the other end connected to a bus electrode 4b as a surface electrode. Each of the wiring members 10a is formed by the electric conductor connection method of this embodiment, using a conductive connecting member 10. Specifically, one end of the conductive connecting member 10 is hot pressed while placed on the bus electrode 4a in the order: metal foil 1, first adhesive layer 2, bus electrode 4a, while the other end of the conductive connecting member 10 is hot pressed while placed on the bus electrode 4b in the order: metal foil 1, second adhesive layer 3, bus electrode 4b, to form the wiring member 10a.

The metal foil 1 and bus electrode 4a, and the metal foil 1 and bus electrode 4b, are electrically connected and anchored by the connection structure shown in FIG. 3. According to this embodiment, the metal foil 1 and bus electrode 4a, and the metal foil 1 and bus electrode 4b, may be connected via conductive particles as shown in FIG. 4.

Figure 6:
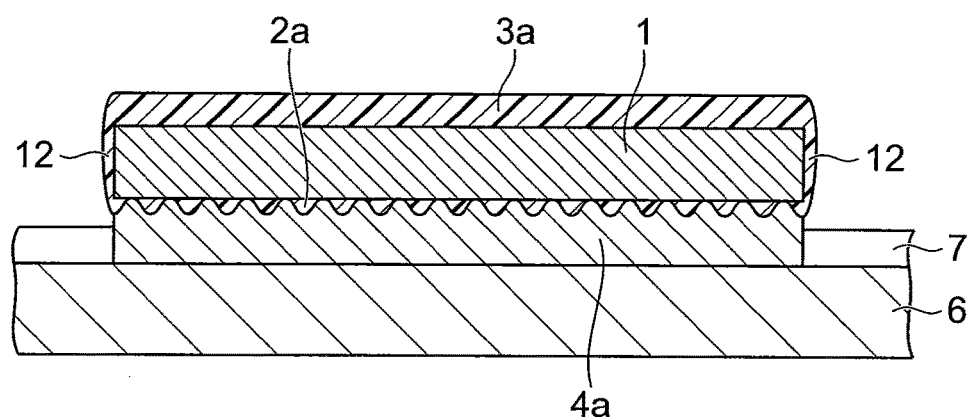
FIG. 6 is a schematic cross-sectional view showing part of a solar cell module according to this embodiment.

FIG. 6 is a cross-sectional view of the solar cell module shown in FIG. 5(c), along line VI-VI. FIG. 6 shows only the front side of the semiconductor wafer 6, omitting the structure of the rear side. The solar cell module of this embodiment is fabricated through a step in which one end of the conductive connecting member 10 is placed on the bus electrode 4a and hot pressed, and it has a structure wherein the metal foil 1 and bus electrode 4a are electrically connected while being bonded by the cured product 2a of the adhesive layer 2 filling the surface roughness sections of the bus electrode 4a. Also according to this embodiment, the sections of the metal foil 1 other than the surface in contact with the bus electrode 4a are covered by the cured adhesive (preferably resin). Specifically, the surface of the metal foil 1 opposite the side in contact with the bus electrode 4a is covered by the cured product 3a of the second adhesive layer 3, and the edges of the metal foil 1 are covered by the cured product 12 of the adhesive that has seeped out by hot pressing during connection. In this type of structure, electrical shorts due to contact between the metal foil and other conductive members can be effectively prevented, thus preventing corrosion of the metal foil and improving the durability of the metal foil.

If the conductive connecting member 10 is in the form of a tape as for this embodiment, the width of the member is extremely small compared to the lengthwise direction, and therefore seepage of the adhesive in the direction of the metal foil edges can be increased, thus making it easier to obtain a reinforcing effect on the strength of the joints.

The embodiments described above are preferred embodiments of the invention, but the invention is not limited thereto. The invention may also be applied in a variety of modifications so long as the gist thereof is maintained.

The electric conductor connection method of the invention can be applied not only for fabrication of the solar battery as described above, but also for fabrication of, for example, short modes of electromagnetic wave shields, tantalum condensers and the like, aluminum electrolytic condensers, ceramic condensers, power transistors, various types of sensors, MEMS-related materials and lead wiring members for display materials.

EXAMPLES

The present invention will now be explained in greater detail with reference to examples, with the understanding that the invention is not meant to be limited to these examples.

Example 1

(1) Fabrication of Adhesive-attached Metal Foil Tape (Electric Conductor Connecting Member)

As a film-forming material, 50 g of a phenoxy resin (trade name: "PKHA" by Inchem, high molecular weight epoxy resin with molecular weight of 25,000) and 20 g of an epoxy resin (trade name: "EPPN" by Nihon Kayaku Co., Ltd.) were dissolved in 175 g of ethyl acetate to obtain a solution. Next, 5 g of a master batch-type curing agent (trade name: "NOVACURE" by Asahi Kasei Corp., mean particle size: 2 μm) comprising imidazole-based microcapsules dispersed in a liquid epoxy resin was added to the solution as a latent curing agent, to obtain an adhesive layer-forming coating solution with a solid content of 30 wt %. The active temperature of the coating solution was 120° C.

The adhesive layer-forming coating solution was then coated onto both surfaces of a double-side roughened electrolytic copper foil (thickness: 35 μm, ten-point height of roughness profile Rz: 2.5 μm, maximum height Ry: 3 μm) using a roll coater, and the coated foil was dried at 110° C. for 5 minutes to form an adhesive layer with a thickness of 18 μm, to obtain a laminated body.

The laminated body was wound up into a roll while taking up a polyethylene film as a separator on the adhesive layer. The wound roll was cut to a width of 2.0 mm to obtain an adhesive-attached metal foil tape.

(2) Connection of Solar Cell Using Conductive Adhesive-attached Metal Foil Tape

There were prepared a solar cell (thickness: 150 μm, size: 15 cm×15 cm) comprising a surface electrode (width: 2 mm×length: 15 cm, Rz: 18 μm, Ry: 20 μm) formed from silver glass paste on the surface of a silicon wafer.

Next, the obtained adhesive-attached metal foil tape was positioned on a solar cell surface electrode and a contact bonding tool (AC-S300 by Nikka Equipment & Engineering Co., Ltd.) was used for hot pressing at 170° C., 2 MPa, 20 seconds to accomplish bonding. This yielded a connection structure wherein the electrolytic copper foil wiring member was connected to the solar cell surface electrode via the conductive adhesive film.

Example 2

An adhesive-attached metal foil tape was obtained in the same manner as Example 1, except that the thickness of the adhesive layer was 14 μm. The adhesive-attached metal foil tape was used to obtain a connection structure in the same manner as Example 1.

Example 3

An adhesive-attached metal foil tape was obtained in the same manner as Example 1, except that the thickness of the adhesive layer was 22 μm. The adhesive-attached metal foil tape was used to obtain a connection structure in the same manner as Example 1.

Example 4

An adhesive-attached metal foil tape was obtained in the same manner as Example 1, except for adding 2 vol % of burr-shaped Ni powder with a particle size distribution width of 1-12 μm (mean particle size: 7 μm) to the adhesive layer-forming coating solution. The adhesive-attached metal foil tape was used to obtain a connection structure in the same manner as Example 1. The added conductive particles are particles that have not been treated for uniformity of particle size, and thus have a wide particle size distribution as explained above.

Example 5

An adhesive-attached metal foil tape was obtained in the same manner as Example 1, except that the thickness of the adhesive layer was 5 μm. A connection structure was obtained in the same manner as Example 1 using this adhesive-attached metal foil tape, except that the solar cell used was a solar cell (thickness: 150 μm, size: 15 cm×15 cm) comprising a surface electrode (width: 2 mm×length: 15 cm, Rz: 5 μm, Ry: 6 μm) formed from silver glass paste on the surface of a silicon wafer.

Example 6

An adhesive-attached metal foil tape was obtained in the same manner as Example 1, except that the thickness of the adhesive layer was 30 μm. A connection structure was obtained in the same manner as Example 1 using this adhesive-attached metal foil tape, except that the solar cell used was a solar cell (thickness: 150 μm, size: 15 cm×15 cm) comprising a surface electrode (width: 2 mm×length: 15 cm, Rz: 30 μm, Ry: 34 μm) formed from silver glass paste on the surface of a silicon wafer.

Example 7

An adhesive-attached metal foil tape was obtained in the same manner as Example 1, except that a smooth copper foil with a thickness of 100 μm was used as the metal foil, and the thickness of the adhesive layer was 20 μm. The adhesive-attached metal foil tape was used to obtain a connection structure in the same manner as Example 1.

Example 8

An adhesive-attached metal foil tape was obtained in the same manner as Example 1, except that an aluminum foil (Rz: 0.1 μm, Ry: 0.2 μm) with a thickness of 20 μm was used as the metal foil, and the thickness of the adhesive layer was 20 μm. The adhesive-attached metal foil tape was used to obtain a connection structure in the same manner as Example 1.

Reference Example 1

An adhesive-attached metal foil tape was obtained in the same manner as Example 1, except that the thickness of the adhesive layer was 9 μm. The adhesive-attached metal foil tape was used to obtain a connection structure in the same manner as Example 1.

Reference Example 2

An adhesive-attached metal foil tape was obtained in the same manner as Example 1, except that the thickness of the adhesive layer was 45 μm. The adhesive-attached metal foil tape was used to obtain a connection structure in the same manner as Example 1.

<Evaluation>

The connection structures of Examples 1-8 and Reference Examples 1-2 were evaluated for conductivity and filling properties in the manner described below, and the connection structures of Examples 1-8 were evaluated for deltaF.F. in the manner described below. The results are shown in Table 1.

[Conductivity]

The resistance between the tape metal foil and the cell electrode was roughly measured for each connected article. A resistance of up to $10^{-1}$ Ω/cm² was considered to be conductivity and was assigned an evaluation of "+", while resistance of greater than $10^{-1}$ Ω/cm² was assigned an evaluation of "−".

[Filling Property]

The degree of seepage of the adhesive in each obtained connected article was evaluated by general observation of the joint. Observable seepage of the adhesive was considered a satisfactory adhesive filling property and was assigned an evaluation of "+", while absence of seepage of the adhesive was considered a poor adhesive filling property and was assigned an evaluation of "−".

[DeltaF.F.]

The IV curve of the obtained connection structure was measured using a solar simulator (trade name: "WXS-155S-10" by Wacom Electric Co., Ltd., AM: 1.5 G). The connection structure was also allowed to stand for 1500 hours in a high-temperature, high-humidity atmosphere at 85° C., 85% RH, and the IV curve was then measured in the same manner. The F.F was derived from each IV curve, and the value of [F.F.(0 h)−F.F.(1500 h)], as the F.F. value before standing in the high-temperature, high-humidity atmosphere minus the F.F. value after standing in the high-temperature, high-humidity conditions, was recorded as Delta(F.F.) and used as the evaluation index. A Delta(F.F.) value of 0.2 or smaller is generally regarded as satisfactory connection reliability.

TABLE 1

| | Metal foil | | Adhesive layer | Electrode surface roughness | | | | Evaluation results | | |
|---|---|---|---|---|---|---|---|---|---|---|
| | | | Thickness | Ten-point height of roughness profile | Maximum height | | | | | |
| | Material | Thickness (μm) | Formed surfaces | t (μm) | Rz (μm) | Ry (μm) | t/Rz | t/Ry | Conductivity | Filling property | Delta (F.F.) |
| Example 1 | Copper foil | 35 | Both | 18 | 18 | 20 | 1.0 | 0.9 | + | + | 0.03 |
| Example 2 | Copper foil | 35 | Both | 14 | 18 | 20 | 0.8 | 0.7 | + | + | 0.03 |

TABLE 1-continued

| | Metal foil | | Adhesive layer | Electrode surface roughness | | | | Evaluation results | | |
|---|---|---|---|---|---|---|---|---|---|---|
| | | | Thickness | Ten-point height of roughness profile | Maximum height | | | | | |
| | Material | Thickness (μm) | Formed surfaces | t (μm) | Rz (μm) | Ry (μm) | t/Rz | t/Ry | Conductivity | Filling property | Delta (F.F.) |
| Example 3 | Copper foil | 35 | Both | 22 | 18 | 20 | 1.2 | 1.1 | + | + | 0.03 |
| Example 4 | Copper foil | 35 | Both | 22 | 18 | 20 | 1.2 | 1.1 | + | + | 0.03 |
| Example 5 | Copper foil | 35 | Both | 5 | 5 | 6 | 1.0 | 0.83 | + | + | 0.03 |
| Example 6 | Copper foil | 35 | Both | 30 | 30 | 34 | 1.0 | 0.88 | + | + | 0.03 |
| Example 7 | Copper foil | 100 | Both | 20 | 18 | 20 | 1.1 | 1.0 | + | + | 0.03 |
| Example 8 | Aluminum foil | 20 | Both | 20 | 18 | 20 | 1.1 | 1.0 | + | + | 0.03 |
| Ref. Ex. 1 | Copper foil | 35 | Both | 9 | 18 | 20 | 0.5 | 0.45 | + | − | — |
| Ref. Ex. 2 | Copper foil | 35 | Both | 45 | 18 | 20 | 2.5 | 2.25 | − | + | — |

Positioning of the electrode/adhesive layer/wiring member (metal foil) was easily accomplished in Examples 1-8 and Reference Examples 1-2, while the connection temperature was a lower temperature (170° C.) than the conventional solder connection temperature and no warping of the board was observed. Also, the connection structures of Examples 1-8 which were fabricated under conditions with a ratio t/Rz between the thickness t of the adhesive layer and the ten-point height of roughness profile Rz on the electrode of 0.8-1.2, all exhibited satisfactory conductivity and filling properties, as well as sufficiently small Delta(F.F.) values, and therefore the connection reliability was excellent. On the other hand, the connection structure of Reference Example 1, connected under conditions with a t/Rz of 0.5, exhibited relatively high conductivity in the thickness direction but had an unsatisfactory adhesive filling property and tended to peel due to low adhesive strength. Also, the connection structure of Reference Example 2 which was connected under conditions with a t/Rz of 2.5 had high seepage of the adhesive from the tape edges and thus satisfactory adhesive force, but the conductivity was inferior.

Effect of the Invention

According to the invention it is possible to provide an electric conductor connection method and electric conductor connecting member which can simplify the connection steps for electrical connection between mutually separate electric conductors, while also obtaining excellent connection reliability. According to the invention it is also possible to provide a connection structure and solar cell module whereby excellent productivity and high connection reliability can both be achieved.

What is claimed is:

1. A solar cell module comprising:
    solar cells having a plurality of electrodes on a front side and a rear side, wherein the electrodes have a surface roughness that creates a plurality of protrusions with a maximum height Ry;
    a plurality of connecting structures, wherein each connecting structure comprises a conductive connecting member hot pressed to a part of two of the plurality of electrodes, thereby electrically connecting each electrode to another electrode of the plurality of electrodes, wherein each connective connecting member comprises a metal foil with a first side and a second side, a first adhesive layer covering the entire first side of the metal foil, and a second adhesive layer covering the entire second side of the metal foil, except for a plurality of parts wherein the plurality of protrusions on the first and second sides of the electrodes directly contact the metal foil,
    wherein each electrode and the metal foil are bonded together by a cured product of the first or second adhesive layer, thereby electrically connecting each electrodes with another electrode of the plurality of electrodes in series, or in parallel, or in series and in parallel, and
    wherein the cured product of the adhesive includes conductive particles, and a maximum particle size $r_{max}$ (pm) of the conductive particles is no greater than the maximum height Ry on the surface of the electrodes.

2. A solar cell module according to claim 1, wherein a ten-point height of roughness profile Rz (μm) on a surface of the electrodes is between 2 μm and 30 μm.

3. A solar cell module according to claim 1, wherein the adhesive comprises a thermosetting resin and a latent curing agent.

4. A solar cell module according to claim 1, wherein the electrodes and metal foil are electrically connected via the conductive particles.

5. A solar cell module according to claim 1, wherein the metal foil comprises at least one metal selected from the group consisting of Cu, Ag, Au, Fe, Ni, Pb, Zn, Co, Ti, Mg, Sn and Al.

6. A solar cell module according to claim 1, wherein at least some sections of the metal foil other than a surface facing the electrodes are covered with a resin.

7. A solar cell module according to claim 1, wherein the conductive particles include at least one type of particle selected from the group consisting of nickel particles, gold-plated nickel particles, plastic particles plated with gold and nickel, and nickel-plated particles.

8. A solar cell module according to claim 1, wherein the thickness of the metal foil is 5 μm to 150 μm.

9. A solar cell module according to claim 1, wherein a height of roughness on a surface of the electrode is between 3 μm and 30 μm.

10. A solar cell module according to claim 1, wherein the adhesive comprises a thermosetting resin.

11. A solar cell module according to claim 1, wherein the adhesive comprises a latent curing agent.

12. A solar cell module according to claim 1, wherein the electrodes on the front side and the rear side are bus electrodes.

13. A solar cell module according to claim 12, wherein the bus electrodes are silver-containing glass paste electrodes.

* * * * *